(12) United States Patent
Irie (10) Patent No.: US 8,164,374 B2
(45) Date of Patent: Apr. 24, 2012

(54) CLOCK GATING CIRCUIT HAVING A SELECTOR THAT SELECTS ONE OF A CONTROL SIGNAL AND A SCAN SIGNAL

(75) Inventor: Kazuyuki Irie, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 105 days.

(21) Appl. No.: 12/461,200

(22) Filed: Aug. 4, 2009

(65) Prior Publication Data

US 2010/0033229 A1 Feb. 11, 2010

(30) Foreign Application Priority Data

Aug. 11, 2008 (JP) ................... 2008-206736

(51) Int. Cl.
*G06F 1/04* (2006.01)
*H03K 3/00* (2006.01)
(52) U.S. Cl. .................. 327/291; 327/294; 327/299
(58) Field of Classification Search .................. 327/291, 327/294, 299
See application file for complete search history.

(56) References Cited

U.S. PATENT DOCUMENTS 7,456,674 B2 * 11/2008 Oakland .................. 327/291
2007/0024318 A1 * 2/2007 Mamidipaka .................. 326/38

OTHER PUBLICATIONS

"Power Complier User Guide Ver. Y-2006.06," Jun. 2006, p. 208, provided by Synopsys, Inc.

* cited by examiner

*Primary Examiner* — Lincoln Donovan
*Assistant Examiner* — John Poos
(74) *Attorney, Agent, or Firm* — McGinn Intellectual Property Law Group, PLLC (57) ABSTRACT

Provided is a clock gating circuit which receives a first clock signal and controls an output of a second clock signal corresponding to the first clock signal in response to a control signal. The clock gating circuit includes: a first latch that latches a signal value of the control signal in synchronization with the first clock signal; an AND that receives the first clock signal and controls an output of the second clock signal in response to an output signal of the first latch; and a second latch that latches a signal value of the output signal of the first latch in synchronization with the first clock signal, and outputs a latched value. This enables execution of a scan test with a simple circuit configuration.

14 Claims, 7 Drawing Sheets

CLOCK GATING CIRCUIT HAVING A SELECTOR THAT SELECTS ONE OF A CONTROL SIGNAL AND A SCAN SIGNAL

BACKGROUND

1. Field of the Invention

The present invention relates to a clock gating circuit having a clock gating function for stopping supply of a clock signal according to an operating state, and more particularly, to a failure detection technique.

2. Description of Related Art

Along with the recent increase in scale of large-scale integration (LSI), a technique for reducing power consumption in LSI design has been required. A clock gating technique is known as an example of the technique for reducing power consumption. The clock gating technique is used for stopping supply of a clock signal to inactive circuits during execution of an application.

In the recent LSI design, automatic layout tools are generally used. When the clock gating technique is employed in the LSI design, a clock gating circuit is usually prepared in advance as a macro cell.

Further, in an LSI manufacturing process, a test for detecting a failure in a circuit is carried out. A scan design technique is known as an example of a design technique for improving the failure detection accuracy of the test.

A circuit shown in FIG. 6 will be described as an example of the clock gating circuit to which the scan 5 design technique is applied. Note that the clock gating circuit switches ON/OFF (propagation/stop) of an output clock signal in response to a control signal (clock enable signal). In the case of the clock gating circuit of the related art, however, a glitch may occur in the output clock signal, depending on the timing of switching the clock enable signal. For this reason, a clock gating circuit 100 shown in FIG. 6 includes a latch circuit 104 for preventing a glitch from occurring.

The clock gating circuit 100 includes an OR gate (hereinafter referred to simply as "OR") 102, an AND gate (hereinafter referred to simply as "AND") 103, and the latch 104. A test enable signal TEN is input to one input terminal of the OR 102 through an external input terminal 105. A clock enable signal CEN is input to the other input terminal of the OR 102 through an external input terminal 106. A signal output from the OR 102 is input to an input terminal LD of the latch 104. A signal output from an output terminal LQ of the latch 104 is input to one input terminal of the AND 103. A clock signal CLK is input to the other input terminal of the AND 103 and to an input terminal LG of the latch 104 through an external input terminal 107. A signal output from the AND 103 is supplied to an external output terminal 108 as a gated clock signal GCLK.

Figure 6:
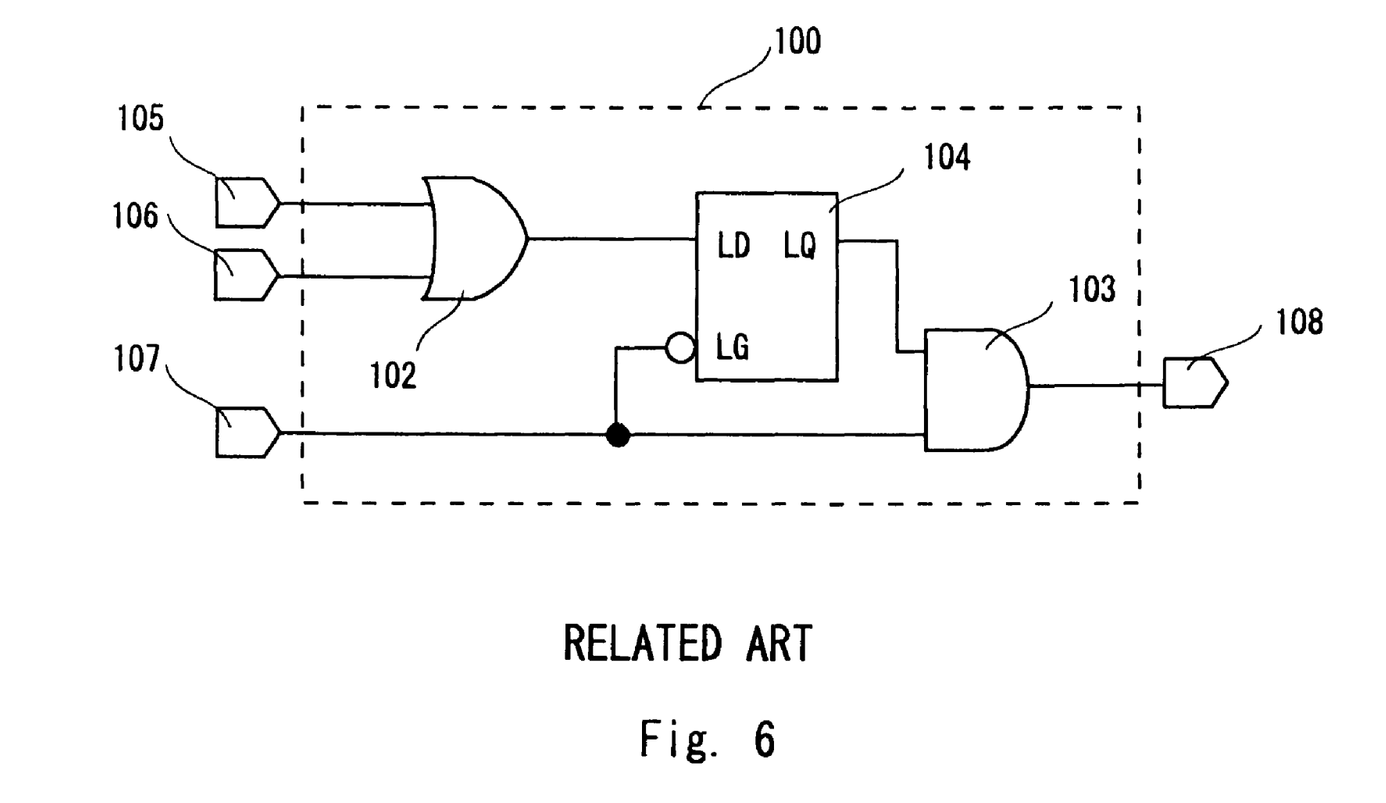
FIG. 6 shows a clock gating circuit of the related art.

In the case of the circuit shown in FIG. 6, mode switching is made between a scan test mode and a normal operation mode based on the TEN signal. During a scan test, for example, the TEN signal is fixed at the level of "1". Thus, the circuit shown in FIG. 6 directly propagates the CLK signal and outputs it as the GCLK signal. In this case, however, the output signal of the latch 104 is fixed at the level of "1". This makes it impossible to detect a failure in the output signal of the latch 104. In other words, the failure detection accuracy is degraded.

Figure 7:
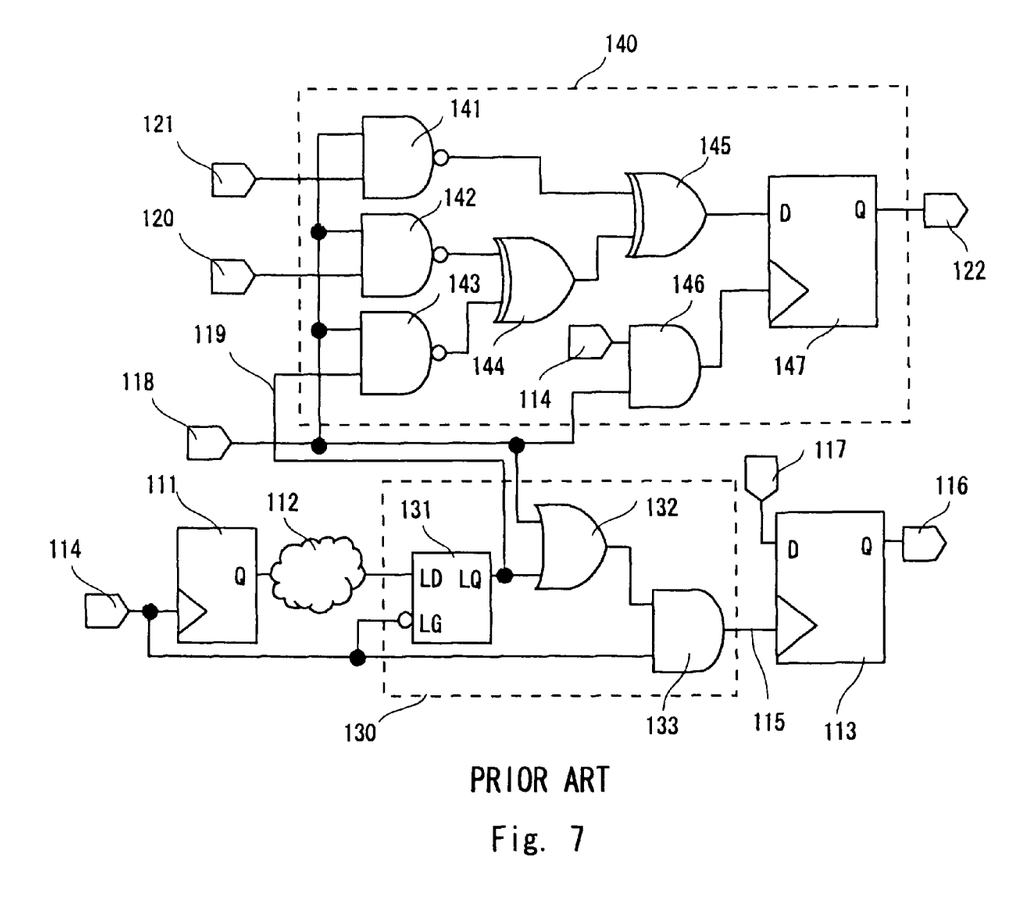
FIG. 7 shows a clock gating circuit adopting a scan design technique of the related art.

A solution for this problem is proposed in "Power Compiler User Guide Ver. Y-2006.06", June 2006, p. 208, provided by Synopsys, Inc. FIG. 7 shows a clock gating circuit and an observation circuit which are disclosed in "Power Compiler User Guide Ver. Y-2006.06", June 2006, p. 208, provided by Synopsys, Inc.

The circuit shown in FIG. 7 has a circuit configuration capable of detecting a failure in the output signal of the latch in the clock gating circuit. The circuit shown in FIG. 7 includes a clock gating circuit 130 as well as an observation circuit 140 including an observation flip-flop 147.

The clock gating circuit 130 includes an OR 132, an AND 133, and a latch 131. The clock enable signal is input to an input terminal LD of the latch 131. A signal output from an output terminal LQ of the latch 131 is input to one input terminal of the OR 132. The test enable signal TEN is input to the other input terminal of the OR 132 through an external input terminal 118. A signal output from the OR 132 is input to one input terminal of the AND 133. The clock signal CLK is input to the other input terminal of the AND 133 and to an input terminal LG of the latch 131 through an external input terminal 114. The AND 133 outputs the gated clock signal GCLK to a clock input terminal of the flip-flop 113 provided at the subsequent stage.

The observation circuit 140 includes three NANDs 141, 142, and 143, two EXOR gates (hereinafter referred to simply as "EXORs") 144 and 145, an AND 146, and the observation flip-flop 147.

The TEN signal is input to one input terminal of each of the NANDs 141, 142, and 143. A signal 119 output from the clock gating circuit 130 (the signal is hereinafter referred to simply as "ENLa signal") is input to the other input terminal of the NAND 143. Note that the ENLa signal 119 is a signal output from the output terminal LQ of the latch 131 in the clock gating circuit 130. Further, in a similar manner as in the NAND 143, an ENLc signal 121 and an ENLb signal 120, which are output from another clock gating circuit (not shown), are input to the other input terminals of the NANDs 141 and 142, respectively.

The signals output from the NANDs 142 and 143 are respectively input to input terminals of the EXOR 144. A signal output from the EXOR 144 is input to one input terminal of the EXOR 145. A signal output from the NAND 141 is input to the other input terminal of the EXOR 145. A signal output from the EXOR 145 is input to an input terminal D of the observation flip-flop 147.

The CLK signal is input to one input terminal of the AND 146. The TEN signal is input to the other input terminal of the AND 146. A signal output from the AND 146 is input to a clock input terminal of the observation flip-flop 147. The observation flip-flop 147 outputs a scan output signal SOT to an external output terminal 122.

Further, FIG. 7 shows flip-flops 111 and 113 as examples of peripheral circuits connected at the preceding and subsequent stages of the clock gating circuit 130. The CLK signal is input to a clock input terminal of the flip-flop 111. A signal output from an output terminal Q of the flip-flop 111 is input to the input terminal LD of the latch 131 through a control logic 112.

Further, the GCLK signal output from the AND 133 is input to the clock input terminal of the flip-flop 113. An output signal 117 output from another circuit is input to an input terminal D of the flip-flop 113. The flip-flop 113 outputs an output signal 116. Note that the clock gating circuit controls the supply of the clock signal by the flip-flop 113.

In this case, the TEN signal is input to the other input terminal of the AND 133 not through the latch 131. Accordingly, the clock gating circuit 130 shown in FIG. 7 has a configuration capable of detecting a failure in the output signal of the latch 131 since the output signal of the latch 131 is not fixed at one voltage level by the TEN signal. Further, the observation circuit 140 shown in FIG. 7 can detect a failure in three clock gating circuits to thereby prevent an increase in circuit size.

SUMMARY

As described above, along with the recent increase in scale of the LSI, there is an increasing demand for countermeasures for saving power consumption. In this regard, however, the present inventor has found a problem of deterioration in failure detection rate. Though the clock gating circuit in which countermeasures for improving the failure detection rate are taken is proposed as a solution for this problem, the circuit configuration of the clock gating circuit of the related art is complicated. This causes a problem of an increase in man-hour for verification of a scan test.

A first exemplary aspect of an embodiment of the present invention is a clock gating circuit which receives a first clock signal (e.g., a clock signal CLK of a first exemplary embodiment of the invention) and controls an output of a second clock signal (e.g., a gated clock signal GCLK of the first exemplary embodiment of the invention) corresponding to the first clock signal in response to a control signal (e.g., a clock enable signal CEN of the first exemplary embodiment of the invention), the clock gating circuit including: a first latch (e.g., a latch 5 of the first exemplary embodiment of the invention) that latches a signal value of the control signal in synchronization with the first clock signal; a first gate (e.g., an AND 4 of the first exemplary embodiment of the invention) that receives the first clock signal and controls an output of the second clock signal in response to an output signal of the first latch; and a second latch (e.g., a latch 6 of the first exemplary embodiment of the invention) that latches a signal value of the output signal of the first latch in synchronization with the first clock signal, and outputs a latched value. This enables execution of a scan test with a simple circuit configuration.

According to an exemplary embodiment of the present invention, it is possible to provide a clock gating circuit and a macro cell that have a simple circuit configuration capable of detecting a failure in order to prevent an increase in man-hour for design.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Exemplary embodiments of the present invention will be described in detail below with reference to the accompanying drawings.

First Exemplary Embodiment

Figure 1:
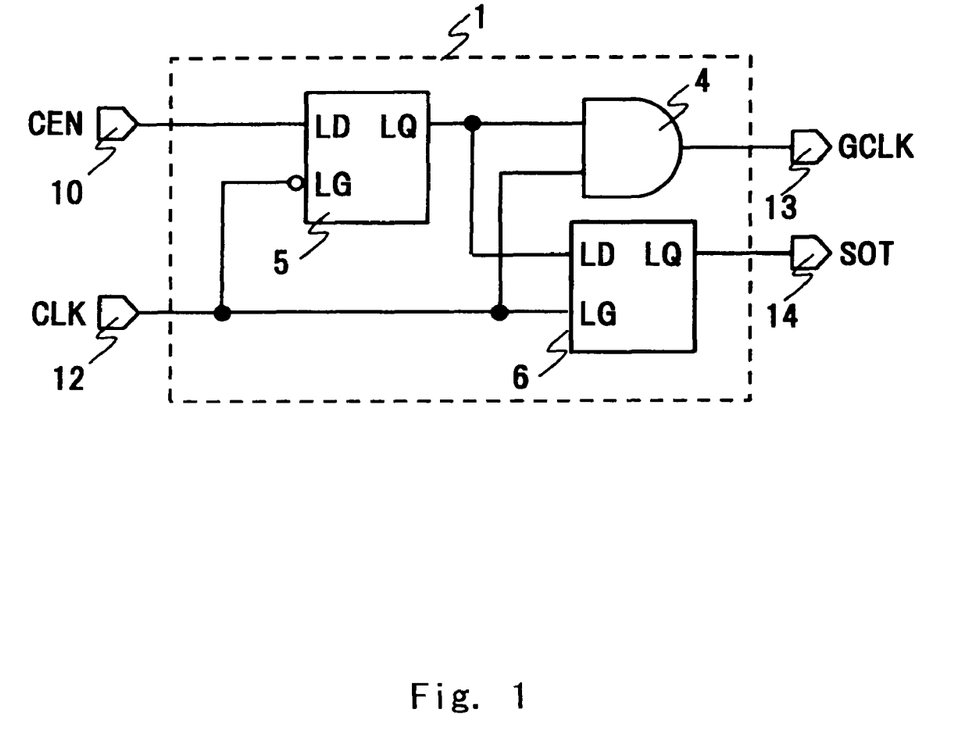
FIG. 1 shows a clock gating circuit according to a first exemplary embodiment of the present invention.

Referring first to FIG. 1, the configuration of a clock gating circuit according to a first exemplary embodiment of the present invention is described. A clock gating circuit 1 shown in FIG. 1 includes a latch (first latch) 5, a latch (second latch) 6 and an AND (first gate) 4, and has a clock gating function.

An external input terminal 10 is connected to an input terminal LD of the latch 5. An output terminal LQ of the latch 5 is connected to one input terminal of the AND 4 and to an input terminal LD of the latch 6. The other input terminal of the AND 4, an input terminal LG of the latch 5, and an input terminal LG of the latch 6 are each connected to an external input terminal 12. An output terminal of the AND 4 is connected to an external output terminal 13. An output terminal LQ of the latch 6 is connected to an external output terminal 14.

Next, referring to FIG. 1, operation of the clock gating circuit according to the first exemplary embodiment of the present invention is described. A clock enable signal (control signal) CEN is input to the input terminal LD of the latch 5 through the external input terminal 10. A signal output from the output terminal LQ of the latch 5 is input to one input terminal of the AND 4 and the input terminal LD of the latch 6. A clock signal (first clock) CLK is input to the other input terminal of the AND 4, the input terminal LG of the latch 5, and the input terminal LG of the latch 6 through the external input terminal 12. The AND 4 outputs a gated clock signal (second clock) GCLK through the external output terminal 13. The latch 6 outputs a scan output signal SOT through the external output terminal 14.

Note that, when the CEN signal is at the level of "1", the clock gating circuit 1 directly propagates the CLK signal and outputs it as the GCLK signal. Meanwhile, when the CEN signal is at the level of "0", the clock gating circuit 1 stops outputting the GCLK signal. In other words, the signal level of the GCLK signal is fixed at one of the signal levels.

In this case, the latch 5 acts as a negative latch. Specifically, when the signal input to the input terminal LG of the latch 5 is at low level, the latch 5 directly propagates and outputs the signal received at the input terminal LD thereof. Further, when the signal input to the input terminal LG of the latch 5 is at high level, the output signal of the latch 5 is held at the preceding signal level.

Meanwhile, the latch 6 acts as a positive latch. Specifically, when the signal input to the input terminal LG of the latch 6 is at high level, the latch 6 directly propagates and outputs the signal received at the input terminal LD thereof. Further, when the signal input to the input terminal LG of the latch 6 is at low level, the output signal of the latch 6 is held at the preceding signal level.

In short, the latch 5 and the latch 6 constitute a flip-flop. This circuit configuration allows the circuit shown in FIG. 1 to detect the signal, which is input to the input terminal LD of the latch 5, at a rising edge of the CLK signal, and to output the signal from the output terminal LQ of the latch 6. In other words, observation of the SOT signal enables detection of a failure in the output signal of the latch 5.

Thus, in the circuit shown in FIG. 1, the latch 5 and the latch 6 which operate in synchronization with the CLK signal form a scan path for a scan test. This enables detection of a failure in the output signal of the latch 5. In this case, the circuit shown in FIG. 1 has a simpler circuit configuration capable of detecting a failure than that of the related art. Accordingly, the circuit shown in FIG. 1 can solve the problem of an increase in man-hour for verification due to a complicated circuit configuration inherent in the related art.

Additionally, in a layout design process, the circuit shown in FIG. 1 allows for greater flexibility in arrangement of cells than that of the related art. This facilitates the timing adjustment (i.e., adjustment of deviations in timing of clock input signals).

Second Exemplary Embodiment

Figure 2:
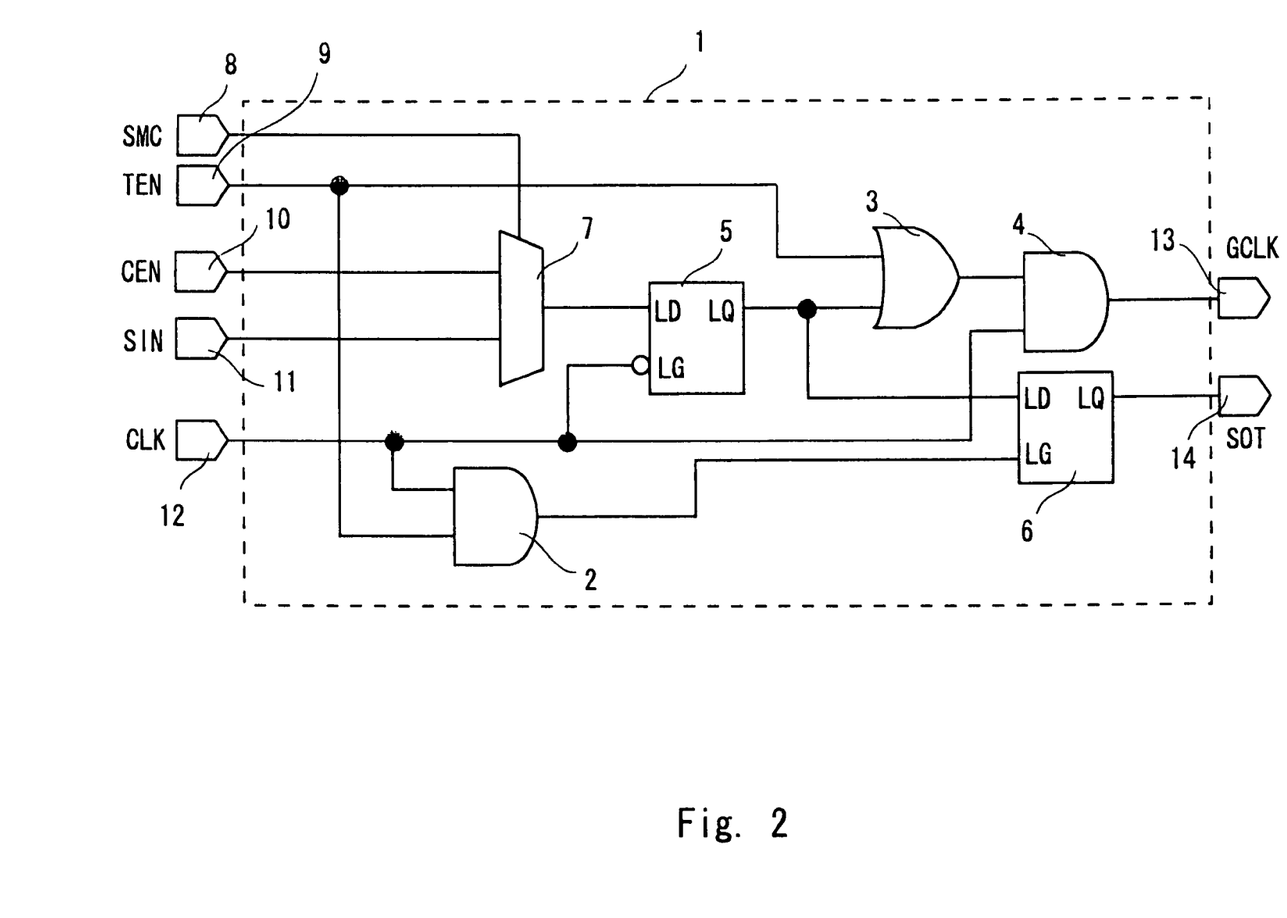
FIG. 2 shows a clock gating circuit according to a second exemplary embodiment of the present invention.

Referring to FIG. 2, the configuration of a clock gating circuit according to a second exemplary embodiment of the present invention will be described. The clock gating circuit 1 shown in FIG. 2 includes the latches 5 and 6, an AND (second gate) 2, the AND 4, an OR 3, and a selector 7, and has a clock gating function.

The external input terminal 10 and an external input terminal 11 are respectively connected to input terminals of the selector 7. An external input terminal 8 is connected to a control terminal of the selector 7. An output terminal of the selector 7 is connected to the input terminal LD of the latch 5. The output terminal LQ of the latch 5 is connected to one input terminal of the OR 3 and to the input terminal LD of the latch 6. The other input terminal of the OR 3 and one input terminal of the AND 2 are each connected to an external input terminal 9.

The other input terminal of the AND 2, the input terminal LG of the latch 5, and one input terminal of the AND 4 are each connected to the external input terminal 12. The other input terminal of the AND 4 is connected to an output terminal of the OR 3. The output terminal of the AND 4 is connected to the external output terminal 13. An output terminal of the AND 2 is connected to the input terminal LG of the latch 6. The output terminal LQ of the latch 6 is connected to the external output terminal 14.

Next, referring to FIG. 2, operation of the clock gating circuit according to the second exemplary embodiment of the present invention will be described. Note that when a test enable signal TEN is at the level of "1", the circuit shown in FIG. 2 indicates a first mode for executing a scan test. Further, when the TEN signal is at the level of "0", the circuit shown in FIG. 2 indicates a second mode for performing a normal operation.

The clock enable signal CEN is input to one input terminal of the selector 7 through the external input terminal 10. A scan input signal (scan signal) SIN is input to the other input terminal of the selector 7 through the external input terminal 11. A scan mode signal SMC is input to the control terminal of the selector 7 through the external input terminal 8. Specifically, the selector 7 selects one of the CEN signal and the SIN signal based on the SMC signal and outputs the selected signal. In the circuit shown in FIG. 2, when the SMC signal indicates "1", the SIN signal is selected as the output signal of the selector 7. Meanwhile, when the SMC signal is at the level of "0", the CEN signal is selected as the output signal of the selector 7. A signal output from the selector 7 is input to the input terminal LD of the latch 5. The clock signal CLK is input to the input terminal LG of the latch 5 through the external input terminal 12.

A signal output from the output terminal LQ of the latch 5 is input to one input terminal of the OR 3. The test enable signal TEN is input to the other input terminal of the OR 3 through the external input terminal 9. A signal output from the OR 3 is input to the other input terminal of the AND 4. The CLK signal is input to one input terminal of the AND 4. The AND 4 outputs the gated clock signal GCLK through the external output terminal 13.

The TEN signal is input to one input terminal of the AND 2. The CLK signal is input to the other input terminal of the AND 2. A signal output from the AND 2 is input to the input terminal LG of the latch 6. A signal output from the output terminal LQ of the latch 5 is input to the input terminal LD of the latch 6. The latch 6 outputs the scan output signal SOT through the external output terminal 14.

In this case, the latch 5 acts as a negative latch. Specifically, when the signal input to the input terminal LG of the latch 5 is at low level, the latch 5 directly propagates and outputs the signal received at the input terminal LD thereof. Further, when the signal input to the input terminal LG of the latch 5 is at high level, the output signal of the latch 5 is held at the preceding signal level.

Meanwhile, the latch 6 acts as a positive latch. Specifically, when the signal input to the input terminal LG of the latch 6 is at high level, the latch 6 directly propagates and outputs the signal received at the input terminal LD thereof. Further, when the signal input to the input terminal LG of the latch 6 is at low level, the output signal of the latch 6 is held at the preceding signal level.

Figure 3:
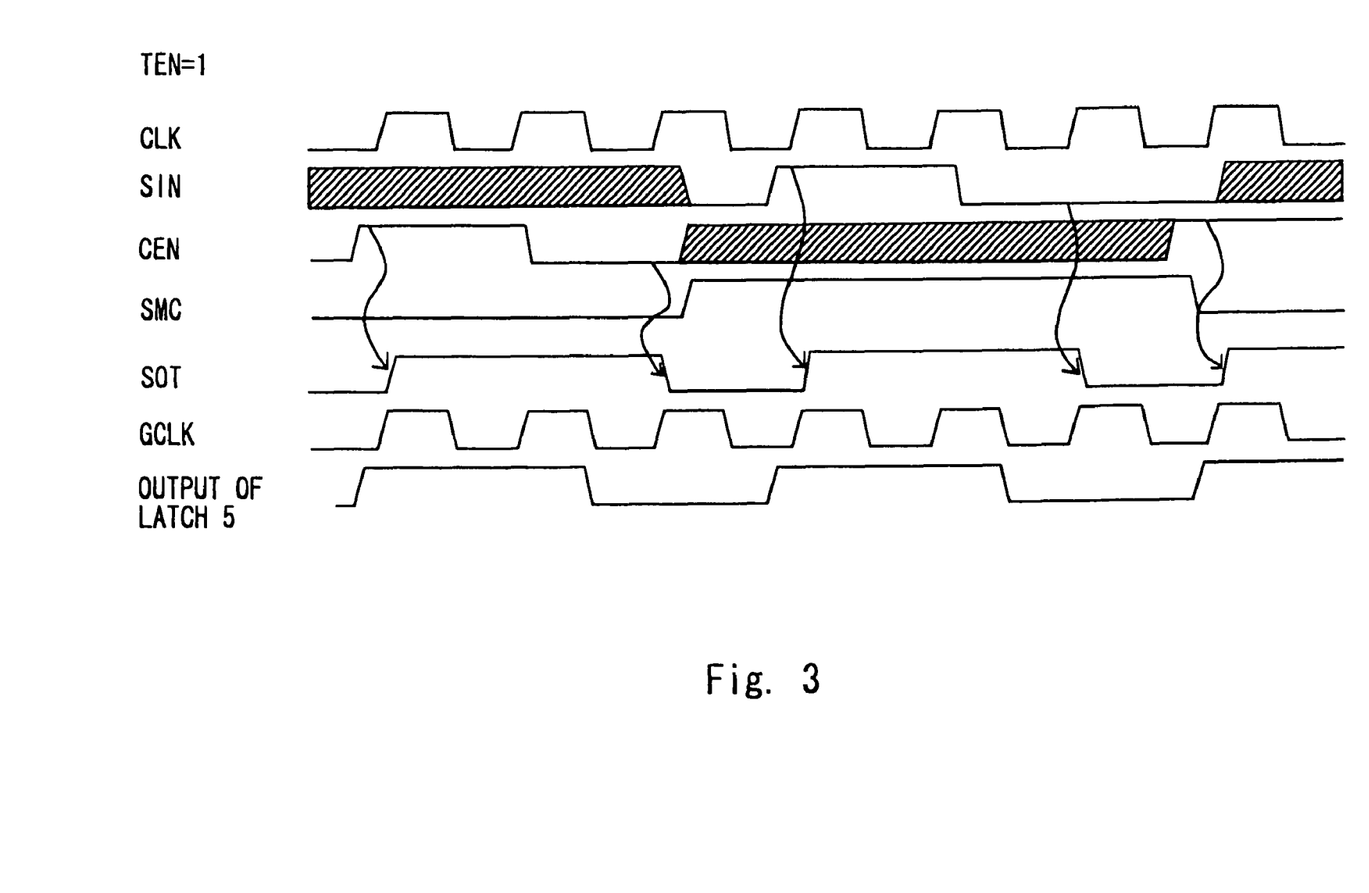
FIG. 3 is a timing diagram (first mode) of the clock gating circuit according to the second exemplary embodiment of the present invention.
Figure 4:
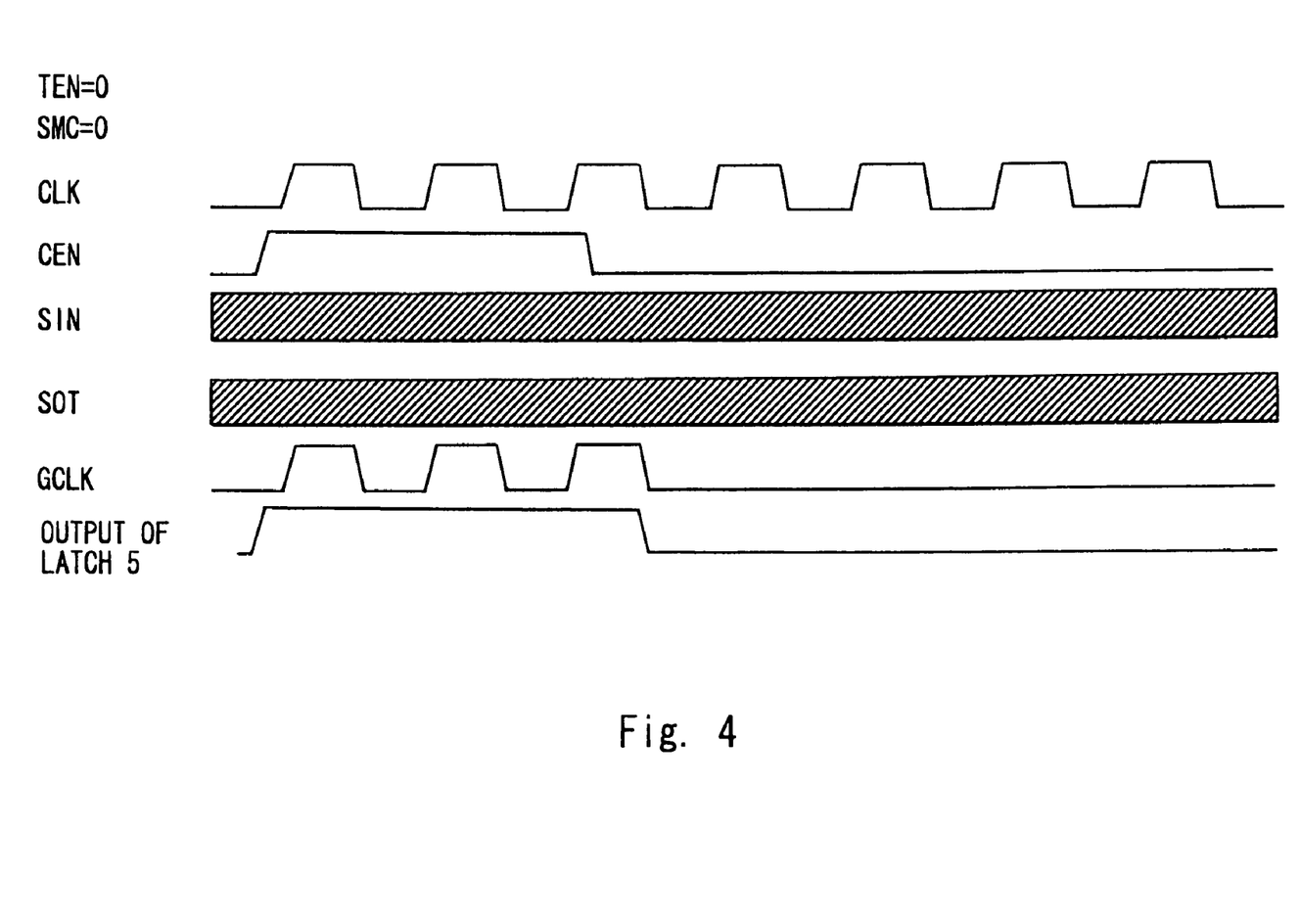
FIG. 4 is a timing diagram (second mode) of the clock gating circuit according to the second exemplary embodiment of the present invention.

FIGS. 3 and 4 are timing diagrams of the clock gating circuit 1 according to an exemplary embodiment of the present invention. FIG. 3 is a timing diagram showing the first mode, and FIG. 4 is a timing diagram showing the second mode.

Referring first to FIG. 3, operation of the first mode will be described. In the first mode, the TEN signal is fixed at the level of "1". Thus, the signal indicating "1" is output from the output terminal of the OR 3, regardless of the output signal of the latch 5. That is, the signal indicating "1" is constantly input to the other input terminal of the AND 4. Accordingly, the AND 4 directly propagates and outputs the CLK signal input to one input terminal thereof. In other words, the clock gating circuit 1 directly outputs the propagated signal of the CLK signal as the GCLK signal.

Further, the output signal of the latch 5 is input to the input terminal LD of the latch 6. Then, the signal is subjected to the operation of the latch 6 and output from the output terminal LQ thereof. In this case, a signal indicating "1" is constantly input to one input terminal of the AND 2. Thus, the AND 2 directly propagates and outputs the CLK signal input to the other input terminal thereof. In other words, the propagated signal of the CLK signal is input to the input terminal LG of the latch 6.

As illustrated in the timing diagram of FIG. 3, the SMC signal indicates "0" in the early stage of operation. In this case, the CEN signal is selected as the output signal of the selector 7. Then, the SMC signal indicates "1" in the middle stage of the operation. In this case, the SIN signal is selected as the output signal of the selector 7. Then, the SMC signal indicates "0" again in the last stage of the operation. In this case, the CEN signal is selected as the output signal of the selector 7. In short, in the case of conducting a scan test, the clock gating circuit 1 can arbitrarily select signals to be input to the latch 5. A signal output from the selector 7 is input to the input terminal LD of the latch 5. Then, the signal is subjected to the operation of the latch 5 and output from the output terminal LQ thereof.

Referring now to FIG. 3, the clock gating circuit outputs the propagated signal of the CLK signal directly as the GCLK signal. This is because it is necessary to cause a subsequent-stage circuit to operate in the first mode. Note that shaded areas in the timing diagram of FIG. 3 indicate indefinite values, similarly hereinafter.

As described above, in the case of the first mode, the CLK signal is propagated and input to the input terminal LG of the latch 6. That is, the latches 5 and 6 perform a flip-flop operation in synchronization with the CLK signal. This circuit configuration allows the circuit shown in FIG. 2 to detect the signal, which is input to the input terminal LD of the latch 5, at the rising edge of the CLK signal, and to output the signal from the output terminal LQ of the latch 6. In other words, observation of the SOT signal enables detection of a failure in the output signal of the latch 5.

Referring next to the timing diagram shown in FIG. 4, operation of the second mode will be described. In the second mode, the TEN signal is fixed at the level of "0", and the SMC signal is also fixed at the level of "0". Thus, the propagated signal of the CEN signal is constantly input to the input terminal LD of the latch 5. Further, a signal output from the output terminal LQ of the latch 5 is directly propagated and input to the other input terminal of the AND 4. Then, the CLK signal is input to one input terminal of the AND 4. Specifically, the AND 4 controls whether to propagate and output the CLK signal based on the CEN signal for which the countermeasures against a glitch are taken. The AND 4 outputs the signal thus controlled as the GCLK signal.

Further, the TEN signal indicates "0", and thus a signal indicating "0" is constantly input to one input terminal of the AND 2. Accordingly, the AND 2 outputs the signal indicating "0" regardless of the level of the signal input to the other input terminal thereof. That is, the signal indicating "0" is input to the input terminal LD of the latch 6. In other words, since the SOT signal is not used in the second mode, supply of the clock signal to the latch 6 is stopped.

In the timing diagram shown in FIG. 4, the CEN signal indicates "1" in the early stage of operation. Then, the CEN signal indicates "0" in and after the middle stage of the operation. When the CEN signal indicates "1", the circuit shown in FIG. 2 directly propagates and outputs the CLK signal as the GCLK signal. Meanwhile, when the CEN signal indicates "0", the circuit shown in FIG. 2 stops outputting the GCLK signal. In other words, in the second mode, the circuit shown in FIG. 2 performs a normal operation as a clock gating circuit.

Thus, in the circuit shown in FIG. 2, the latch 5 and the latch 6 which operate in synchronization with the CLK signal form a scan path for a scan test. This enables detection of a failure in the output signal of the latch 5. In this case, the circuit shown in FIG. 2 has a simpler circuit configuration capable of detecting a failure than that of the related art. Accordingly, the circuit shown in FIG. 2 can solve the problem of an increase in man-hour for verification due to a complicated circuit configuration inherent in the related art.

Further, the circuit shown in FIG. 2 controls the output of the OR 3 based on the TEN signal. Specifically, the circuit shown in FIG. 2 directly propagates and outputs the CLK signal as the GCLK signal during the scan test. This makes it possible to conduct a scan test on the subsequent-stage circuit to which the GCLK signal is supplied. Furthermore, the circuit shown in FIG. 2 includes the selector 7, which enables selection of one of the CEN signal and the SIN signal to be used. Thus, the circuit can arbitrarily supply necessary signals to the latch 5 during the scan test. Moreover, the circuit shown in FIG. 2 controls the output of the AND 2 based on the TEN signal. In other words, since the SOT signal is not used during the normal operation, the supply of the clock signal to the latch 6 is stopped. This results in a reduction of power consumption.

Additionally, in a layout design process, the circuit shown in FIG. 2 allows for greater flexibility in arrangement of cells than that of the related art. This facilitates the timing adjustment.

Third Exemplary Embodiment

Figure 5:
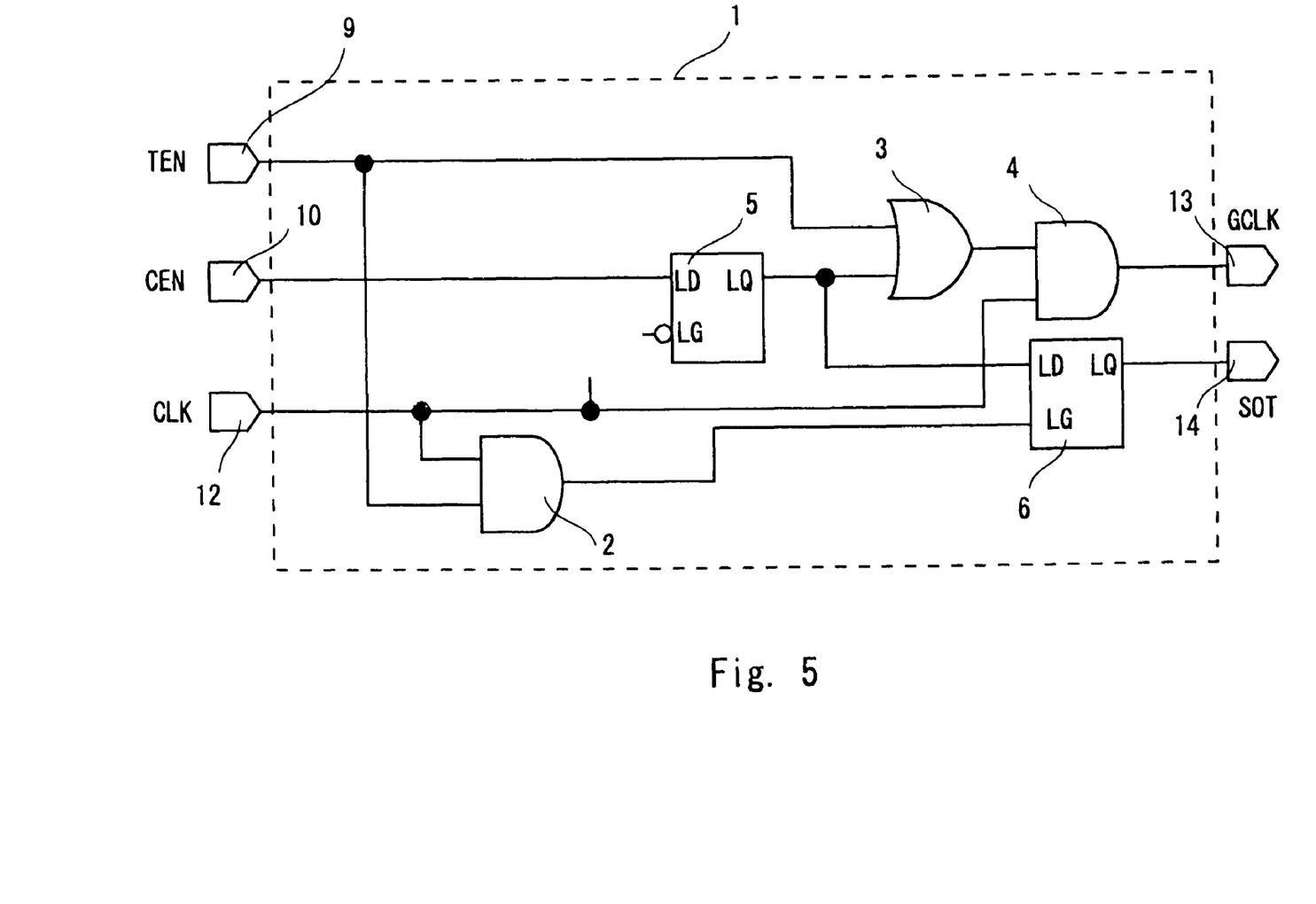
FIG. 5 shows a clock gating circuit according to a third exemplary embodiment of the present invention.

The circuit configuration using the SIN signal has been described by way of example in the second exemplary embodiment of the present invention. Meanwhile, a circuit configuration using no SIN signal is described by way of example in a third exemplary embodiment of the present invention. Referring first to FIG. 5, the configuration of a clock gating circuit according to the third exemplary embodiment of the present invention will be described. The clock gating circuit 1 shown in FIG. 5 includes the two latches 5 and 6, the two ANDs 2 and 4, the OR 3, and has a clock gating function.

The external input terminal 10 is connected to the input terminal LD of the latch 5. The output terminal LQ of the latch 5 is connected to one input terminal of the OR 3 and to the input terminal LD of the latch 6. The other input terminal of the OR 3 and one input terminal of the AND 2 are each connected to the external input terminal 9.

The other input terminal of the AND 2, the input terminal LG of the latch 5, and one input terminal of the AND 4 are each connected to the external input terminal 12. The other input terminal of the AND 4 is connected to the output terminal of the OR 3. The output terminal of the AND 4 is connected to the external output terminal 13. The output terminal of the AND 2 is connected to the input terminal LG of the latch 6. The output terminal LQ of the latch 6 is connected to the output terminal 14.

Referring next to FIG. 5, operation of the clock gating circuit according to the third exemplary embodiment of the present invention will be described. Note that when the TEN signal is at the level of "1", the circuit shown in FIG. 5 indicates the first mode for executing a scan test. Further, when the TEN signal is at the level of "0", the circuit shown in FIG. 5 indicates the second mode for performing the normal operation.

The CEN signal is input to the input terminal LD of the latch 5 through the external input terminal 10. The CLK signal is input to the input terminal LG of the latch 5 through the external input terminal 12. A signal output from the output terminal LQ of the latch 5 is input to one input terminal of the OR 3. The TEN signal is input to the other input terminal of the OR 3 through the external input terminal 9. A signal output from the OR 3 is input to the other input terminal of the AND 4. The CLK signal is input to one input terminal of the AND 4. The AND 4 outputs the GCLK signal through the external output terminal 13.

The TEN signal is input to one input terminal of the AND 2. The CLK signal is input to the other input terminal of the AND 2. A signal output from the AND 2 is input to the input terminal LG of the latch 6. A signal output from the output terminal LQ of the latch 5 is input to the input terminal LD of the latch 6. The latch 6 outputs the SOT signal through the external output terminal 14.

In this case, the latch 5 acts as a negative latch. Specifically, when the signal input to the input terminal LG of the latch 5 is at low level, the latch 5 directly propagates and outputs the signal received at the input terminal LD thereof. Further, when the signal input to the input terminal LG of the latch 5 is at high level, the output signal of the latch 5 is held at the preceding signal level.

Meanwhile, the latch 6 acts as a positive latch. Specifically, when the signal input to the input terminal LG of the latch 6 is at high level, the latch 6 directly propagates and outputs the signal received at the input terminal LD thereof. Further, when the signal input to the input terminal LG of the latch 6 is at low level, the output signal of the latch 6 is maintained the preceding signal level.

As shown in FIG. 5, when the SIN signal is not necessary, there is no need to provide a control circuit associated with the SIN signal. Accordingly, the circuit shown in FIG. 5 can be achieved with a simpler circuit configuration.

Fourth Exemplary Embodiment

The clock gating circuits according to the first to third exemplary embodiments of the present invention can be prepared as macro cells in advance. As a result, the macro cells can be used at any given stage of the LSI design. In a fourth exemplary embodiment of the present invention, a description is given of advantages of preparing the clock gating circuit according to an exemplary embodiment of the present invention as a macro cell in advance.

The recent layout design process is generally performed using an automatic layout design tool. In a circuit of the related art shown in FIG. 7, for example, the timings of clock signals input to flip-flops 111, 113, and 147 are automatically adjusted so as to be synchronized with each other.

The flip-flop 147 is provided mainly for the purpose of detecting a failure in an output signal of a latch 131. Accordingly, the timing of the clock signal input to the flip-flop 147 needs to be adjusted so as to be synchronized with the clock signal input to an input terminal LG of the latch 131, instead of being synchronized with the clock signals input to the flip-flops 111 and 113.

Thus, the layout design process using the automatic layout design tool requires an extra operation to make a setting so that the timing adjustment between the clock signal input to the flip-flop 147 and the clock signal input to the other flip-flops is not performed. Additionally, the layout design process requires an extra operation to make a setting so that the timing adjustment between the clock signal input to the flip-flop 147 and the clock signal input to the input terminal LG of the latch 131 is performed.

To execute normal data transfer between the latch 131 and the flip-flop 147, it is necessary to reduce a wiring delay as much as possible. For this reason, in the layout design process, a clock gating circuit 130 and an observation circuit 140 need to be arranged close to each other. In the circuit shown in FIG. 7, however, a plurality of clock gating circuits are connected to one observation circuit 140. This makes it extremely difficult to arrange all the clock gating circuits and the observation circuit 140 close to each other.

Such a problem can be solved by preparing the clock gating circuit according to an exemplary embodiment of the present invention as a macro cell in advance. When the circuit shown in FIG. 1 is prepared as a macro cell, for example, the timing adjustment between the latches 5 and 6 and the other flip-flops is not performed. This eliminates the need of the operation of making a setting so that the timing adjustment between the latches 5 and 6 and the other flip-flops is not performed. Furthermore, a delay difference between the clock signals respectively input to the latches 5 and 6 can be reduced by preparing the macro cell including the latches 5 and 6 which are arranged close to each other. Moreover, a delay of data generated between the latches 5 and 6 can be reduced. This eliminates the need of an extra operation for timing adjustment.

In this manner, the clock gating circuits of the first to third exemplary embodiments of the present invention are prepared as macro cells, thereby facilitating the design while taking the timing adjustment into consideration. This allows suppression of the increase in man-hour for development.

Note that in the above exemplary embodiments of the present invention, the circuit configuration in which the GCLK signal is fixed at low level when the clock gating circuit stops supplying the clock signal has been described by way of example. It is obvious, however, that the same effects can be obtained using a circuit configuration in which the GCLK signal is fixed at high level.

The first to fourth exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A clock gating circuit which receives a first clock signal and controls an output of a second clock signal corresponding to the first clock signal in response to a control signal, the clock gating circuit comprising:
    a first latch that latches a signal value of the control signal in synchronization with the first clock signal;
    a first gate that receives the first clock signal and controls the output of the second clock signal in response to an output signal of the first latch;
    a second latch that latches a signal value of the output signal of the first latch in synchronization with the first clock signal, and outputs a latched value; and
    a second gate that controls the output of the second latch in response to a test enable signal and the first clock signal, wherein the first latch and the second latch form a scan path for a scan test.

2. The clock gating circuit according to claim 1, wherein each of the first latch and the second latch latches a signal value of an input signal at a different signal level of the first clock signal.

3. The clock gating circuit according to claim 1, wherein the second gate controls an output of the first clock signal to the second latch in response to the test enable signal for switching between a normal operation mode and a scan test mode.

4. The clock gating circuit according to claim 1, wherein the first gate controls the output of the second clock signal in response to the output signal of the first latch and the test enable signal for switching between a normal operation mode and a scan test mode.

5. The clock gating circuit according to claim 1, further comprising a selector that selects one of the control signal and a scan signal for observing an operation of the first latch, and supplies a selected signal to the first latch.

6. The clock gating circuit according to claim 1, wherein the clock gating circuit serves as a macro cell.

7. The clock gating circuit according to claim 1, wherein the first gate comprises an AND gate.

8. The clock gating circuit according to claim 1, wherein the second gate comprises an AND gate.

9. The clock gating circuit according to claim 1, further comprising a third gate that controls an output of the first gate in response to a test enable signal and the output signal of the first latch.

10. The clock gating circuit according to claim 9, wherein the first gate receives an output of the second gate and a clock signal and outputs to the second clock signal.

11. The clock gating circuit according to claim 9, wherein the third gate comprises an OR gate.

12. A clock gating circuit which receives a first clock signal and controls an output of a second clock signal corresponding to the first clock signal in response to a control signal, the clock gating circuit comprising:
  a first gate that receives the first clock signal and a test enable signal;
  a first latch that latches a signal value of the control signal in synchronization with the first clock signal;
  a second latch that latches a signal value of the output signal of the first latch in synchronization with an output of the first gate, and outputs a latched value;
  a second gate that controls an output of the first clock signal corresponding to the first latch in response to the test enable signal; and
  a third gate that controls an output of the second clock signal in response to an output of the second gate and the first clock signal.

13. A clock gating circuit which receives a first clock signal and controls an output of a second clock signal corresponding to the first clock signal in response to a control signal, the clock gating circuit comprising:
  a first latch that latches a signal value of the control signal in synchronization with the first clock signal;
  a first gate that controls an output of the first clock signal corresponding to the first latch in response to the test enable signal;
  a second gate that controls the output of the second clock signal in response to an output of the first gate and the first clock signal; and
  a second latch that latches a signal value of the output signal of the first latch in synchronization with the first clock signal, and outputs a latched value.

14. The clock gating circuit according to claim 13, further comprising a third gate that controls the output of the second latch in response to a test enable signal and the first clock signal.

* * * * *